(12) United States Patent
Akerman et al.

(10) Patent No.: US 8,829,406 B2
(45) Date of Patent: *Sep. 9, 2014

(54) OPTICAL PROJECTOR WITH BEAM MONITOR INCLUDING SENSING INTENSITY OF BEAM PATTERN NOT PROJECTED TOWARD AN OBJECT

(71) Applicant: PrimeSense Ltd., Tel Aviv (IL)

(72) Inventors: Ronen Akerman, Modi'in (IL); Dudu Voschina, Hod Hasharon (IL); Niv Galezer, Tel Aviv (IL); Yoed Arieli, D.N Hamovil (IL); Tomer Segev, Jerusalem (IL); Zafrir Mor, Ein Habsor (IL); Alexander Shpunt, Tel Aviv (IL)

(73) Assignee: Primesense Ltd., Tel Aviv (IL)

( * ) Notice: Subject to any disclaimer, the term of this patent is extended or adjusted under 35 U.S.C. 154(b) by 0 days.

This patent is subject to a terminal disclaimer.

(21) Appl. No.: 13/936,234

(22) Filed: Jul. 8, 2013

(65) Prior Publication Data

US 2013/0292545 A1    Nov. 7, 2013

Related U.S. Application Data

(63) Continuation of application No. 12/945,908, filed on Nov. 15, 2010, now Pat. No. 8,492,696.

(60) Provisional application No. 61/261,336, filed on Nov. 15, 2009, provisional application No. 61/300,465, filed on Feb. 2, 2010.

(51) Int. Cl.
*G01J 1/32* (2006.01)

(52) U.S. Cl.
USPC .......................................... 250/205; 250/551

(58) Field of Classification Search
USPC .......... 250/205, 551, 239, 221, 208.1, 214.1; 369/44.24–44.42, 112.07
See application file for complete search history.

(56) References Cited

U.S. PATENT DOCUMENTS

| | | | |
|---|---|---|---|
| 3,796,498 A | | 3/1974 | Post |
| 5,406,543 A | * | 4/1995 | Kobayashi et al. ........... 369/121 |
| 6,031,611 A | | 2/2000 | Rosakis et al. |
| 6,664,998 B1 | * | 12/2003 | Kyoya et al. .................. 347/241 |
| 6,707,027 B2 | | 3/2004 | Liess et al. |
| 2004/0082112 A1 | | 4/2004 | Stephens |
| 2009/0090937 A1 | | 4/2009 | Park |
| 2011/0295331 A1 | | 12/2011 | Wells et al. |

FOREIGN PATENT DOCUMENTS

| | | |
|---|---|---|
| JP | 2008300106 A | 12/2008 |
| JP | 2011118178 A | 6/2011 |
| WO | 2007105205 A2 | 9/2007 |

OTHER PUBLICATIONS

U.S. Appl. No. 12/330,766 Office Action dated Jul. 16, 2013.
International Application PCT/IB2013/051986 Search Report dated Jul. 30, 2013.
U.S. Appl. No. 13/008,042 Office Action dated Jul. 15, 2013.

(Continued)

*Primary Examiner* — Que T Le
(74) *Attorney, Agent, or Firm* — D. Kligler IP Services Ltd

(57) ABSTRACT

Optical apparatus includes a device package, with a radiation source contained in the package and configured to emit a beam of coherent radiation. A diffractive optical element (DOE) is mounted in the package so as to receive and diffract the radiation from the radiation source into a predefined pattern comprising multiple diffraction orders. An optical detector is positioned in the package so as to receive and sense an intensity of a selected diffraction order of the DOE.

20 Claims, 5 Drawing Sheets

(56) References Cited

OTHER PUBLICATIONS

U.S. Appl. No. 13/567,095 Office Action dated Oct. 1, 2013.

U.S. Appl. No. 13/008,042 Office Action dated Dec. 3, 2013.
Japanese Patent Application # 2010-251347 Office Action Dated Feb. 5, 2014.

* cited by examiner

OPTICAL PROJECTOR WITH BEAM MONITOR INCLUDING SENSING INTENSITY OF BEAM PATTERN NOT PROJECTED TOWARD AN OBJECT

CROSS-REFERENCE TO RELATED APPLICATION

This application is a continuation of U.S. patent application Ser. No. 12/945,908, filed Nov. 15, 2010, which claims the benefit of U.S. Provisional Patent Application 61/261,336, filed Nov. 15, 2009, and of U.S. Provisional Patent Application 61/300,465, filed Feb. 2, 2010, which are both incorporated herein by reference.

FIELD OF THE INVENTION

The present invention relates generally to optical pattern projection, and specifically to monitoring the performance of a projector.

BACKGROUND OF THE INVENTION

Optical pattern projection is used in a variety of applications, such as optical three-dimensional (3D) mapping, area illumination, and LCD backlighting. In some applications, diffractive optical elements (DOEs) are used in creating a desired projection pattern. DOE-based projector designs are described, for example, in U.S. Patent Application Publication 2009/0185274, whose disclosure is incorporated herein by reference.

SUMMARY

The performance of optical projectors of a given type may vary initially due to manufacturing tolerances and subsequently due to conditions in the field. In some applications, it is important to ensure that such variations to not exceed certain limits.

There is therefore provided, in accordance with an embodiment of the present invention, optical apparatus, including a device package and a radiation source, which is contained in the package and configured to emit a beam of coherent radiation. A diffractive optical element (DOE) is mounted in the package so as to receive and diffract the radiation from the radiation source into a predefined pattern including multiple diffraction orders. An optical detector is positioned in the package so as to receive and sense an intensity of a selected diffraction order of the DOE.

In some embodiments, the optical detector is configured to output a signal that is responsive to the intensity, and the apparatus includes a controller, which is coupled to receive and process the signal so as to monitor a performance of the apparatus. Typically, the controller is configured to inhibit an operation of the apparatus when the signal is outside a predefined range.

In a disclosed embodiment. the radiation source includes a laser diode.

The selected diffraction order may be a zero order of the DOE, and the optical detector may be positioned so as to receive the zero order that is reflected back from the DOE. In one embodiment, the DOE is tilted relative to an axis of the beam emitted by the radiation source so as to direct the back-reflected zero order toward the optical detector.

In another embodiment, the selected diffraction order is a high order of the DOE. Typically, the apparatus is configured to project the pattern over a predefined angular range, and the optical detector is positioned to receive the radiation transmitted through the DOE at an angle that is outside the angular range.

There is also provided, in accordance with an embodiment of the present invention, an optical method, which includes transmitting a beam of coherent radiation through a diffractive optical element (DOE), mounted in a package, so as to diffract the radiation into a predefined pattern including multiple diffraction orders. A performance of the DOE is monitored by sensing an intensity of a selected diffraction order of the DOE using an optical detector positioned in the package.

There is additionally provided, in accordance with an embodiment of the present invention, mapping apparatus, including a projection subassembly, including a device package, a radiation source, which is contained in the package and configured to emit a beam of coherent radiation, and a diffractive optical element (DOE), which is mounted in the package so as to receive and diffract the radiation from the radiation source into a predefined pattern including multiple diffraction orders. An optical detector is positioned in the package so as to receive a selected diffraction order of the DOE and to output a signal that is response to an intensity of the selected diffraction order. An imaging subassembly is configured to capture an image of the pattern that is projected onto an object. Processing circuitry is configured to process the image in order to produce a three-dimensional (3D) map of the object, and to process the signal in order to monitor a performance of the DOE.

The present invention will be more fully understood from the following detailed description of the embodiments thereof, taken together with the drawings in which:

DETAILED DESCRIPTION OF EMBODIMENTS

Overview

Figure 1:
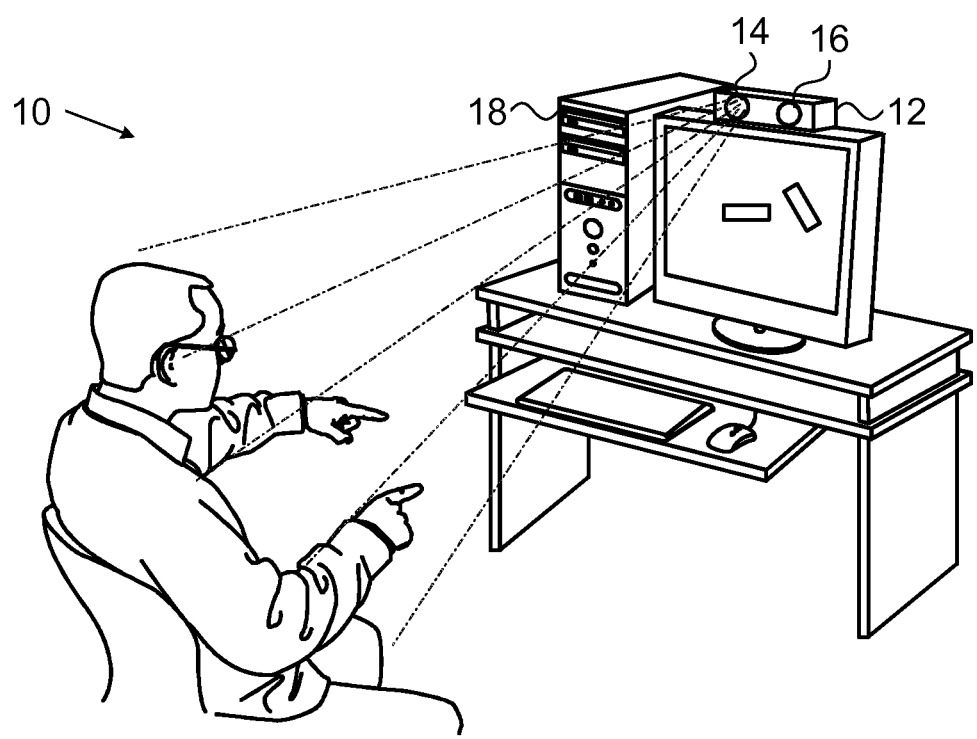
FIG. 1 is a schematic, pictorial illustration of a system for optical 3D mapping, in accordance with an embodiment of the present invention.

Optical projectors based on diffractive optical elements (DOEs) sometimes suffer from the "zero-order problem," which is described in the above-mentioned US 2009/0185274: A portion of the input beam of the projector (the zero diffraction order) may not be diffracted by the projection optics and may thus continue through to the projection volume.

The "efficiency" of a DOE is a measure of the amount of input energy that the DOE diffracts, in relation to the energy of the incoming beam. This efficiency can vary in production due to manufacturing tolerances. It can also change during the lifetime and operation of the projector for various reasons, for example:

Humidity entering the projector can condense on the DOE surface and lower its efficiency.

Vapors of glue (used in the production process) can attach to the DOE and degrade its performance.

Excess heat, due to a malfunction or misuse, can deform the DOE and lower its efficiency.

Such changes in efficiency, with concomitant increases in the zero-order intensity, can compromise system performance and may have various other undesirable consequences.

Embodiments of the present invention that are described hereinbelow address this problem by incorporating a built-in beam monitor, in the form of an integral optical detector, into a DOE-based projector. The detector signal can be continuously or intermittently monitored by a controller in order to evaluate the DOE efficiency and inhibit operation of the projector if the signal is outside a certain safe range. Such embodiments thus prevent eye safety hazards that could otherwise arise due to DOE efficiency degradation over the lifetime of the projector.

In the disclosed embodiments, optical apparatus comprises a radiation source, which is contained in a device package and is configured to emit a beam of coherent radiation. The radiation source may comprise a laser diode, for example, and may emit radiation in the visible, infrared or ultraviolet range (the spectral regions that are generally referred to as "light"). A DOE, mounted in the package, diffracts the radiation from the radiation source into a predefined pattern comprising multiple diffraction orders. An optical detector, such as a photodiode, is positioned in the package so as to receive and sense the intensity of a selected diffraction order of the DOE. The "selected diffraction order" may be sensed individually, or it may alternatively be sensed together with one or more adjacent diffraction orders.

Various detection configurations may be in different embodiments. For example, the detector may sense the zero order of the DOE directly (typically the reflected zero order, in order not to disrupt the projected pattern). Alternatively, the detector may sense a high diffraction order transmitted by the DOE, typically at an angle that is outside the range of the projected pattern itself. A "high order" in this context means at least the second diffraction order, or possibly the third, fourth, or still higher order.

Although the embodiments described below relate specifically to applications involving projection of optical patterns, particularly for three-dimensional (3D) mapping, the principles of these embodiments may similarly be applied in other applications in which there is a need to monitor the diffraction performance of a DOE.

System Description

FIG. 1 is a schematic, pictorial illustration of a system 10 for optical 3D mapping, in accordance with an embodiment of the present invention. Methods and systems for 3D mapping based on projected patterns in systems of this sort are described, for example, in PCT International Publications WO 2007/043036, WO 2007/105205, WO 2008/120217, and WO 2010/004542, whose disclosures are incorporated herein by reference.

System 10 comprises an imaging device 12, comprising a projection subassembly 14, which generates and projects a pattern onto a region. (In the pictured example, this region contains a human user of the system.) Details of possible designs and operation of projection subassemblies of this sort are shown in the figures that follow and are described hereinbelow with reference thereto. An image capture subassembly 16 in device 12 captures an image of the pattern appearing on the user. An image processor 18 processes image data generated by device 12 in order to reconstruct a 3D map of the user, as explained in the above-mentioned PCT publications. Although processor 18 is shown in FIG. 1, for visual clarity, as a separate unit from imaging device 12, some or all of the processing functions of processor 18 may be performed by an embedded controller and/or other suitable dedicated circuitry within the housing of imaging device 12 or otherwise associated with the imaging device.

The 3D map that is generated by processor 18 may be used for a wide range of different purposes. For example, the map may be used to provide a gesture-based user interface, in which user movements detected by means of device 12 control an interactive computer application, such as a game. Alternatively, system 20 may be used to create 3D maps for substantially any application in which 3D coordinate profiles are needed.

As can be seen in FIG. 1, projection subassembly 14 projects radiation toward the user, and a portion of this radiation may impinge on the user's eyes. When coherent radiation is used for projection (which has advantages of high brightness and efficiency, particularly in conjunction with DOEs), it is important to ensure that the zero-order component does not exceed eye safety limits. The above-mentioned U.S. Patent Application Publication 2009/0185274, as well as U.S. patent application Ser. No. 12/840,312, filed Jul. 21, 2010, whose disclosure is incorporated herein by reference, describe optical designs that are useful in reducing the zero-order intensity. It is still desirable, however, to monitor the performance of the projector so as to ensure that the zero-order intensity remains within permissible limits.

EMBODIMENT I

Figure 2:
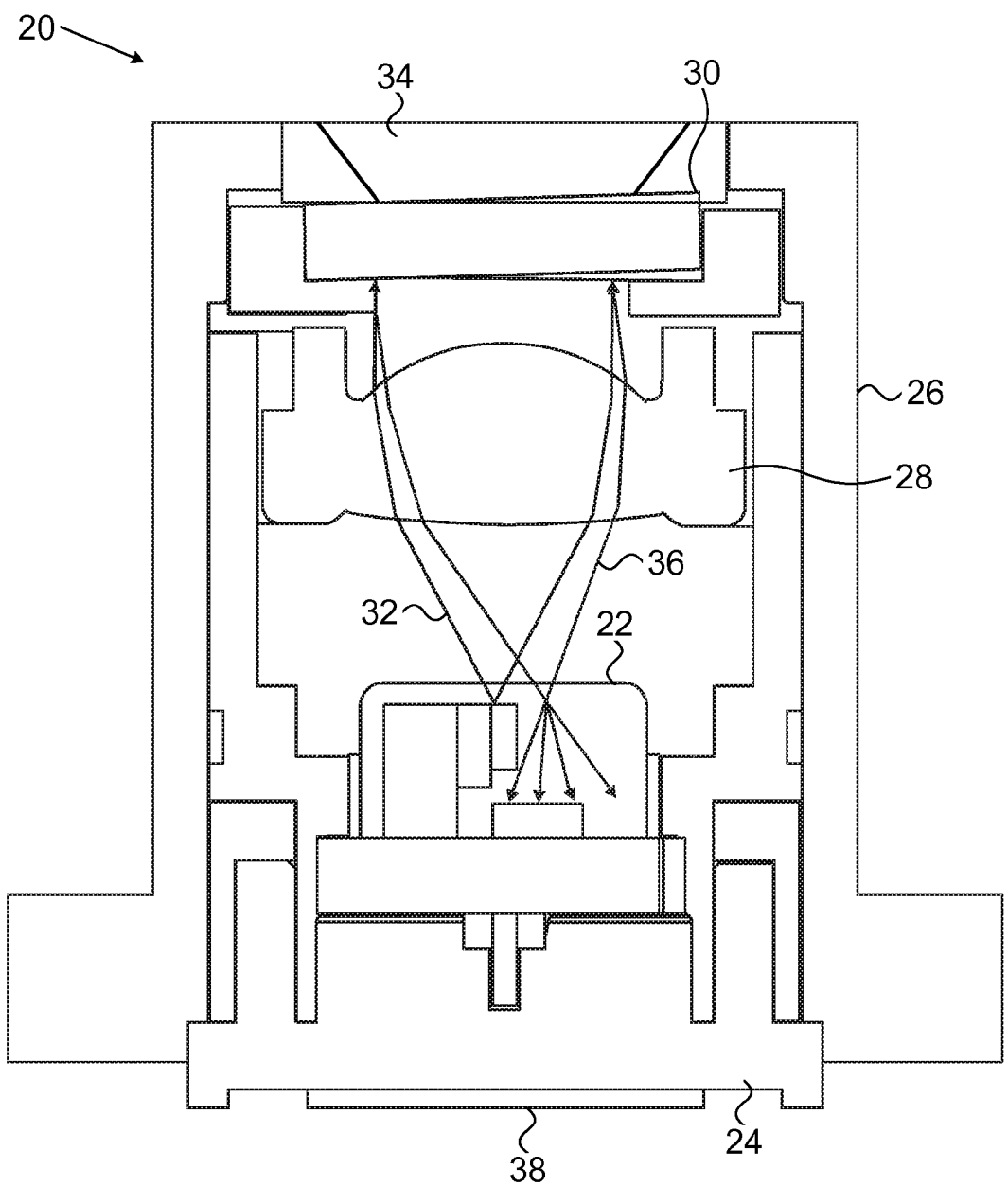
FIG. 2 is a schematic, sectional view of an optical pattern projector, in accordance with an embodiment of the present invention.

FIG. 2 is a schematic, sectional view of an optical pattern projector 20, in accordance with an embodiment of the present invention. This projector may be installed and used in place of subassembly 14 in device 12 (FIG. 1). Projector 20 comprises a radiation source assembly 22, containing a laser diode and monitoring photodiode, which are described in detail below with reference to FIGS. 3A and 3B. Assembly 22 is mounted on a base 24 and contained in a device package 26, along with the other components of projector 20. These components include a collimating lens 28 and a DOE 30.

Figure 3A:
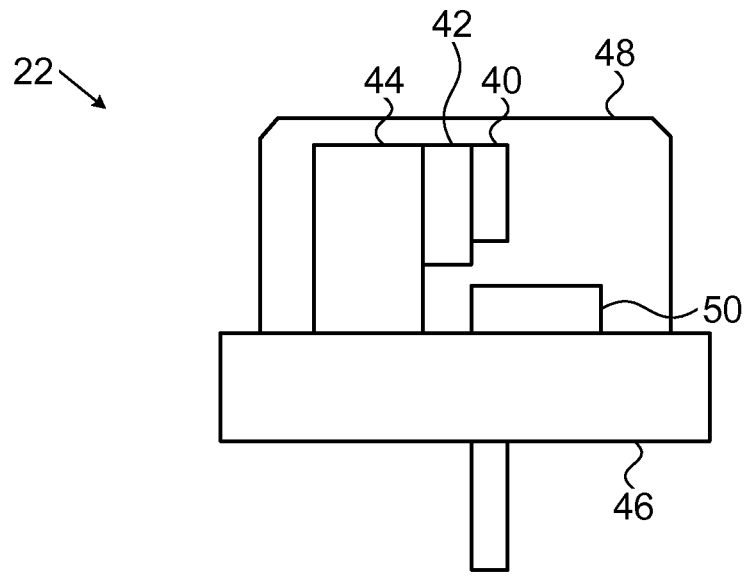
FIGS. 3A and 3B are schematic sectional and top views, respectively, of a radiation source assembly used in an optical pattern projector, in accordance with an embodiment of the present invention.
Figure 3B:
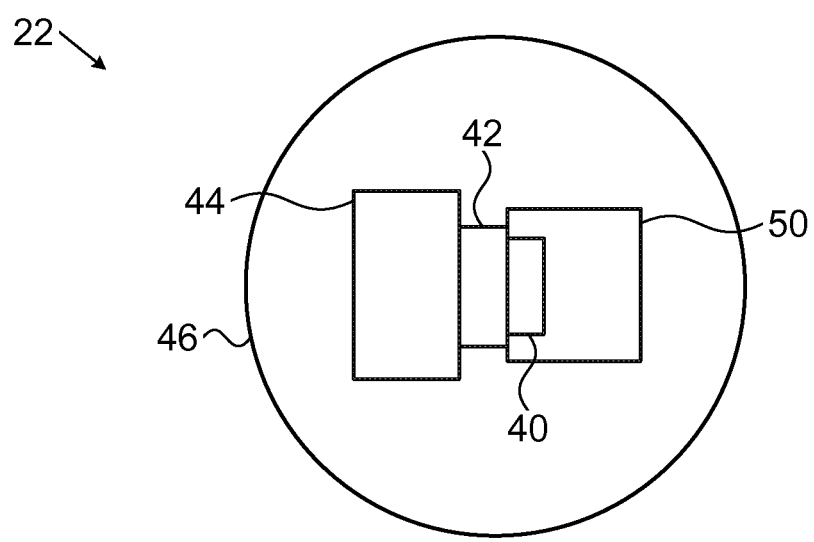

FIGS. 3A and 3B are schematic sectional and top views, respectively, of radiation source assembly 22. A laser diode 40, which typically emits infrared radiation, is mounted on a submount 42, which is fixed to a package stem 44 inside a "can" 46, such as a standard TO-56 can. The laser diode emits radiation through a window 48 in the upper side of the can. An optical detector, in the form of a monitoring photodiode (MPD) 50, is mounted in the can below the laser diode.

Referring back to FIG. 2, laser diode 40 emits an output beam 32 of radiation, which is collimated by lens 28. DOE 30 diffracts the collimated beam to generate a pattern comprising multiple diffraction orders, which is projected out through an exit window 34 of package 26. The projected beam includes a certain zero-order component (which the DOE may be designed to minimize). A portion of this zero-order component is reflected back from the DOE into package 26. This portion is identified as a reflected beam 36 in the figure.

To enable MPD 50 to sense this reflected zero-order component, DOE 30 may be tilted slightly relative to the axis of beam 32. Typically, for the purposes of the present embodiment, a tilt of 2-3° is sufficient (exaggerated for visual clarity in FIG. 2). This tilt has no significant impact on the projected pattern, but it causes reflected beam 36 to be offset from output beam 32, thereby striking MPD 50. The MPD outputs a signal, via a connector 38, in response to the intensity of the reflected beam. (Other pins on the same connector may be used to provide the driving current to the laser diode.) The intensity sensed by the MPD may include components of one or more adjacent, higher diffraction orders. Alternatively, the MPD may be positioned so as to sense reflection of one or more of the higher diffraction orders instead of the zero order, and the higher-order intensity may provide an indication of diffraction efficiency as in Embodiment II below.

A controller, such as processor 18 (FIG. 1), monitors the MPD signal. If the signal level increases above a certain threshold level, the controller may conclude that the zero-order intensity of the projector has increased. The controller may then inhibit the operation of projector 20, typically by reducing or shutting off the driving current to laser diode 40, in order to ensure that the intensity does not exceed the permitted safety limit. Additionally or alternatively, the controller may issue an alarm to an operator of the projector or take other appropriate action.

In the position of MPD 50 that is shown in FIGS. 3A and 3B, the MPD will receive not only reflected beam 36, but also back-lobe emission from laser diode 40. In this configuration, the MPD may be used to monitor both increases in the intensity of the zero order and decreases in overall intensity that may result from to degradation of the laser diode over time. If the MPD signal increases, the controller will inhibit projector operation, as explained above. On the other hand, in the case of a decrease in the MPD signal, the controller may increase the driving current to the laser diode in order to maintain the desired output intensity of the projector.

Alternatively, if back-lobe monitoring of laser diode 40 is not required, MPD 50 may be shifted away from the laser diode, for example further to the right in the view shown in FIG. 3A.

EMBODIMENT II

Figure 4:
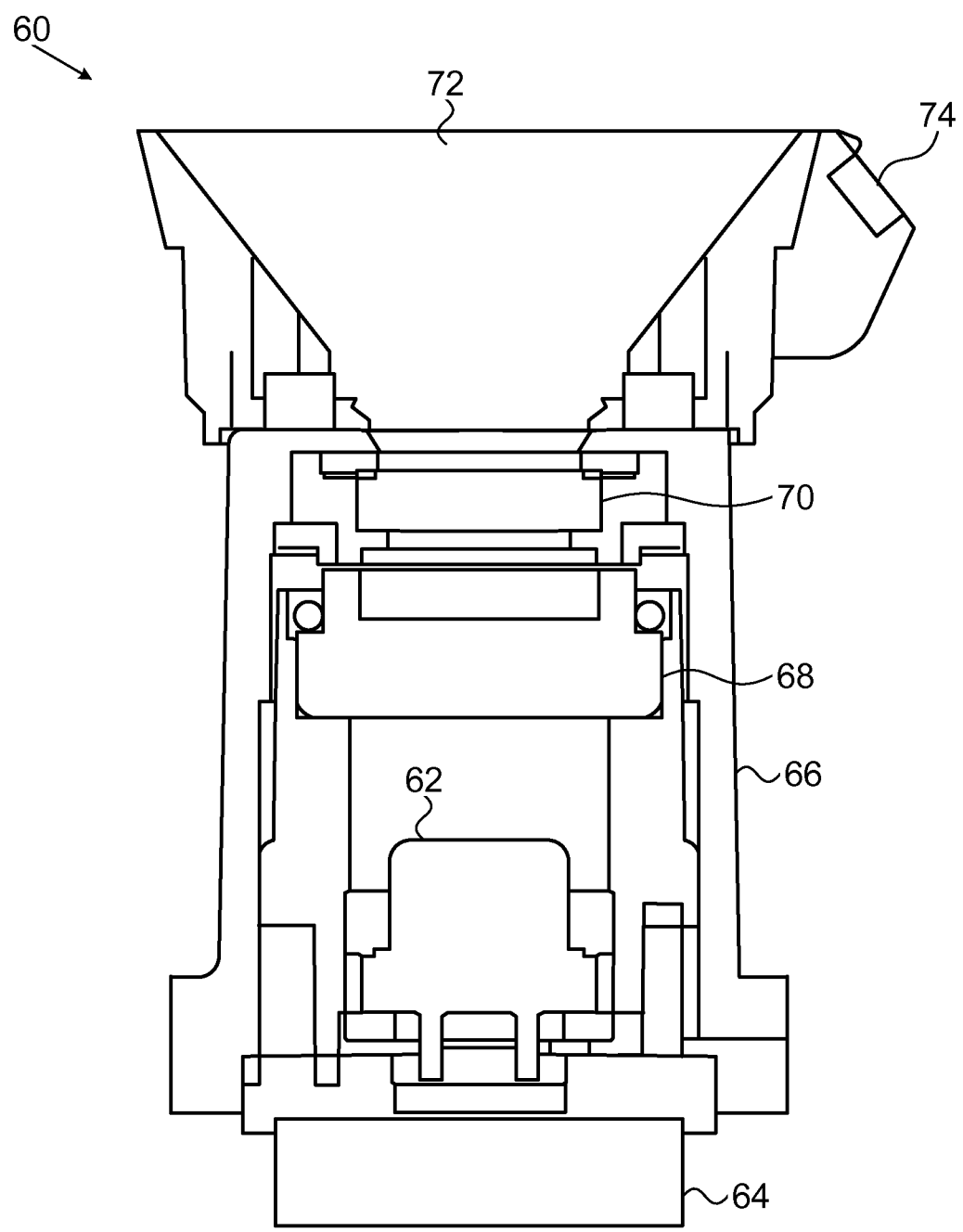
FIG. 4 is a schematic, sectional view of an optical pattern projector, in accordance with another embodiment of the present invention.

FIG. 4 is a schematic, sectional view of an optical pattern projector 60, in accordance with another embodiment of the present invention. Projector 60 and its components are similar in operation to projector 20, except that in projector 60, the optical detector monitors the zero-order intensity indirectly, by sensing the intensity of one or more high diffraction orders transmitted by the DOE.

Projector 60 comprises a radiation source assembly 62, which typically contains a laser diode but may or may not contain a monitoring photodiode. Assembly 62 is mounted on a base 64 and contained in a device package 66, along with the other components of projector 20, including a collimating lens 68 and a DOE 70. The pattern generated by DOE 70 is projected through an exit window 72, which defines the angular range of the projected pattern.

A monitoring photodiode (MPD) 74 senses one or more of the high diffraction orders that are generated by DOE 70, at an angle that is typically outside the angular range of the projected pattern. These higher orders are typically outside the field of view of the projector, and they are typically the first to decrease when the efficiency of the DOE begins to drop. In other words, if the diffraction efficiency of the DOE decreases, the intensity of the high-order diffracted radiation sensed by MPD 74 will also decrease. Such a decrease will typically be accompanied by an increase of the zero-order intensity. Therefore, if the signal received by the controller (such as processor 18) from MPD 74 drops below a permitted level, the controller will inhibit the driving current to the laser diode, as explained above.

Figure 5:
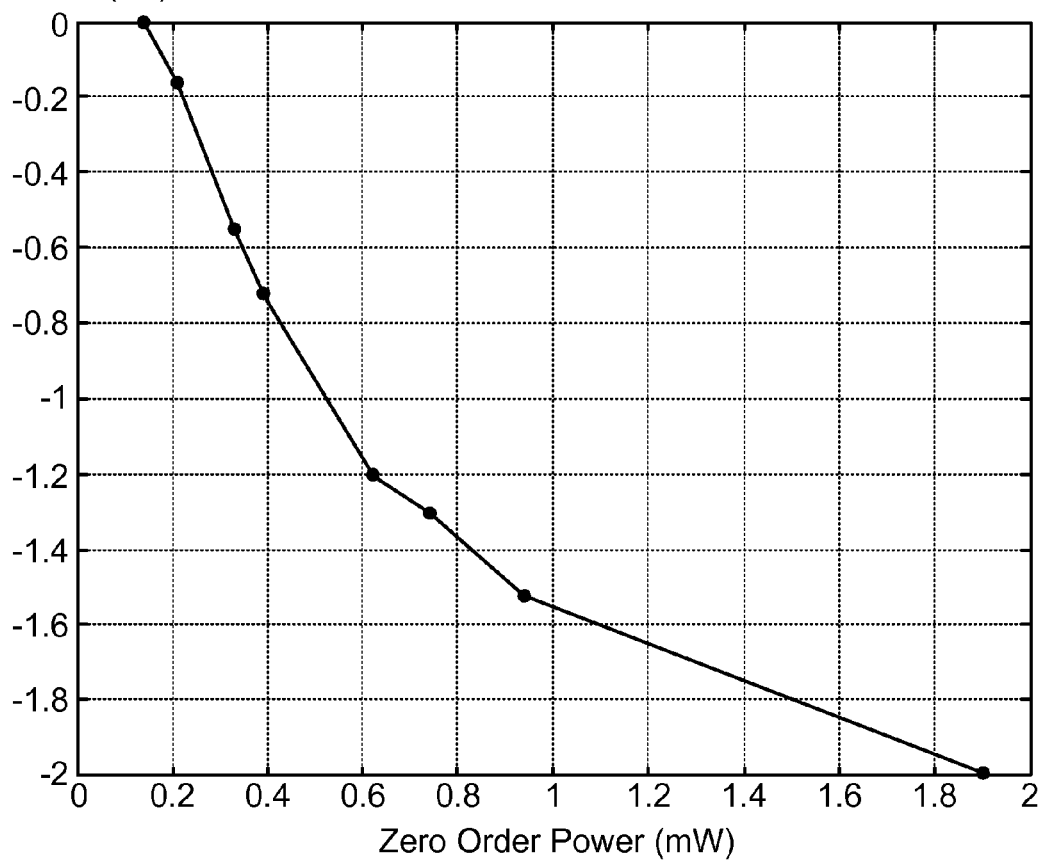
FIG. 5 is a plot that schematically illustrates the performance of a projector beam monitor, in accordance with an embodiment of the present invention.

FIG. 5 is a plot that schematically illustrates the performance of the monitoring function of MPD 74 in projector 60, in accordance with an embodiment of the present invention. The plot shows experimental results, in which the horizontal axis corresponds to the measured zero-order optical power emitted from projector 60, and the decrease in the current signal output from MPD 74, relative to a baseline value, is shown on the vertical axis. The plot demonstrates that the MPD signal decrease is a reliable indicator of the increase in zero-order intensity. When the MPD signal drops below a certain permitted range, the controller may conclude that the zero-order intensity has increased dangerously and may then take the necessary steps to inhibit projector operation.

Although the above embodiments relate to certain specific projector configurations and certain applications of such projectors, the use of an integral optical detector for monitoring a certain diffraction order may likewise be used in other configurations and applications. It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. Optical apparatus, comprising:
a device package;
a radiation source, contained in the package and configured to emit a beam of coherent radiation;
a diffractive optical element (DOE), mounted in the package so as to receive and diffract the radiation from the radiation source into a predefined pattern comprising multiple diffraction orders that are projected from the package toward an object; and
an optical detector, which is positioned in the package so as to receive and sense an intensity of a portion of the pattern that is produced by the DOE but is not projected toward the object.

2. The apparatus according to claim 1, wherein the optical detector is configured to output a signal that is responsive to the intensity, and comprising a controller, which is coupled to receive and process the signal so as to monitor a performance of the apparatus.

3. The apparatus according to claim 2, wherein the controller is configured to inhibit an operation of the apparatus when the signal is outside a predefined range.

4. The apparatus according to claim 3, wherein the diffraction orders projected toward the object include a zero order, and wherein the signal is indicative of an intensity of the zero order, and the controller is configured to inhibit the operation of the apparatus when the signal indicates that the intensity of the zero order has increased.

5. The apparatus according to claim 1, wherein the radiation source comprises a laser diode.

6. The apparatus according to claim 1, wherein the portion of the pattern received by the optical detector comprises a zero order of the DOE.

7. The apparatus according to claim 6, wherein the optical detector is positioned so as to receive the zero order that is reflected back from the DOE.

8. The apparatus according to claim 7, wherein the DOE is tilted relative to an axis of the beam emitted by the radiation source so as to direct the back-reflected zero order toward the optical detector.

9. The apparatus according to claim 1, wherein the portion of the pattern received by the optical detector comprises a high order of the DOE.

10. The apparatus according to claim 9, wherein the apparatus is configured to project the pattern over a predefined angular range, and wherein the optical detector is positioned to receive the radiation transmitted through the DOE at an angle that is outside the angular range.

11. An optical method, comprising:
transmitting a beam of coherent radiation through a diffractive optical element (DOE), mounted in a package, so as to diffract the radiation into a predefined pattern comprising multiple diffraction orders that are projected from the package toward an object; and
monitoring a performance of the DOE by sensing, using an optical detector positioned in the package, an intensity of a portion of the pattern that is produced by the DOE but is not projected toward the object.

12. The method according to claim 11, wherein monitoring the performance comprises generating a signal that is responsive to the intensity, and processing the signal so as to monitor the performance.

13. The method according to claim 12, and comprising inhibiting the beam when the signal is outside a predefined range.

14. The method according to claim 13, wherein the diffraction orders projected toward the object include a zero order, and wherein the signal is indicative of an intensity of the zero order, and wherein the beam is inhibited when the signal indicates that the intensity of the zero order has increased.

15. The method according to claim 11, wherein the radiation source comprises a laser diode.

16. The method according to claim 11, wherein the portion of the pattern received by the optical detector comprises a zero order of the DOE.

17. The method according to claim 16, wherein monitoring the performance comprises receiving and measuring the zero order that is reflected back from the DOE.

18. The method according to claim 17, wherein the DOE is tilted relative to an axis of the beam emitted by the radiation source so as to direct the back-reflected zero order toward the optical detector.

19. The method according to claim 11, wherein the portion of the pattern received by the optical detector comprises a high order of the DOE.

20. The method according to claim 19, wherein the DOE is configured to project the pattern over a predefined angular range, and wherein monitoring the performance comprises receiving and measuring the radiation transmitted through the DOE at an angle that is outside the angular range.

* * * * *